United States Patent [19]

Muramatsu

[11] 4,215,418

[45] Jul. 29, 1980

[54] INTEGRATED DIGITAL MULTIPLIER CIRCUIT USING CURRENT MODE LOGIC

[75] Inventor: John J. Muramatsu, Hermosa Beach, Calif.

[73] Assignee: TRW Inc., Redondo Beach, Calif.

[21] Appl. No.: 920,776

[22] Filed: Jun. 30, 1978

[51] Int. Cl.$^2$ .......................... G06F 7/50; G06F 7/52
[52] U.S. Cl. .................................. 364/757; 307/216; 364/784
[58] Field of Search ............... 364/754, 757, 758, 784; 307/209, 213, 215, 216, 218, 249, 255, 313

[56] References Cited

U.S. PATENT DOCUMENTS

| 3,519,810 | 7/1970 | Priel et al. | 307/216 X |
| 3,900,724 | 8/1975 | McIver et al. | 364/758 |
| 4,071,904 | 1/1978 | Miller | 364/757 |

Primary Examiner—Jerry Smith
Attorney, Agent, or Firm—Fulwider, Patton, Rieber, Lee & Utecht

[57] ABSTRACT

A parallel digital multiplier circuit fabricated in accordance with an advanced triple diffusion process providing feature geometry down to a minimum of two microns and junction depths of less than two microns, wherein a high packing density provided by the fabrication process is utilized to full advantage by the use of current mode logic, which requires relatively few and relatively small resistors, uses only inherently faster NPN transistors, employs a relatively small voltage swing between logic levels, has unlimited cascading capability, and provides a superior speed-power product.

8 Claims, 16 Drawing Figures

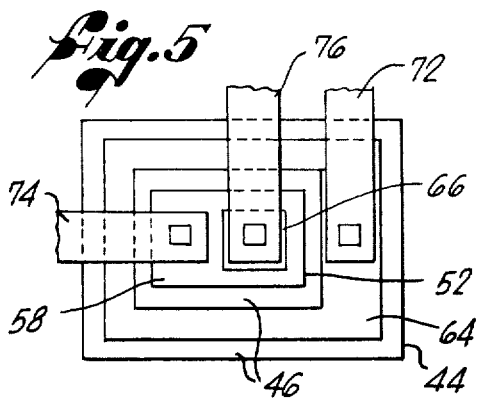
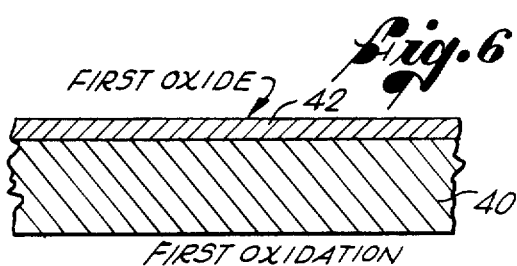
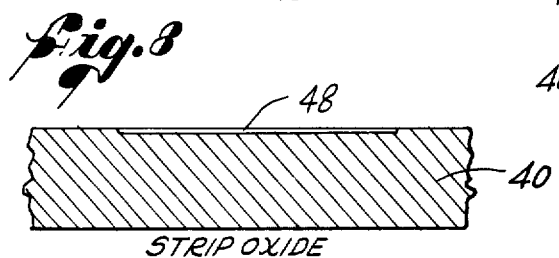
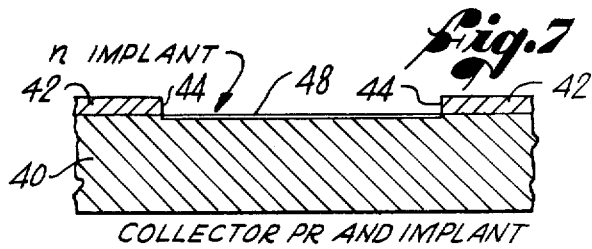
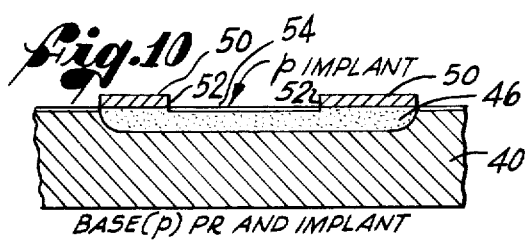
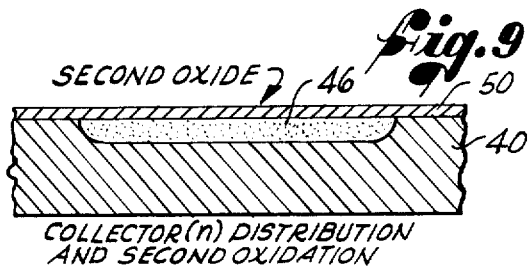
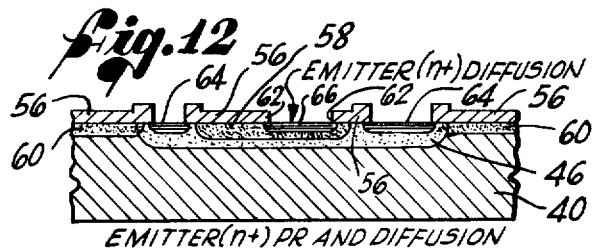
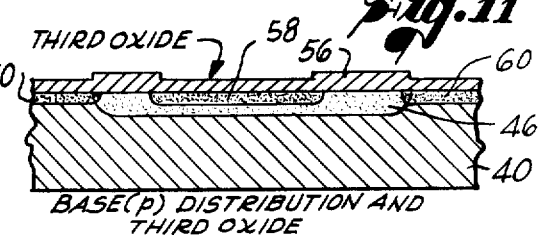
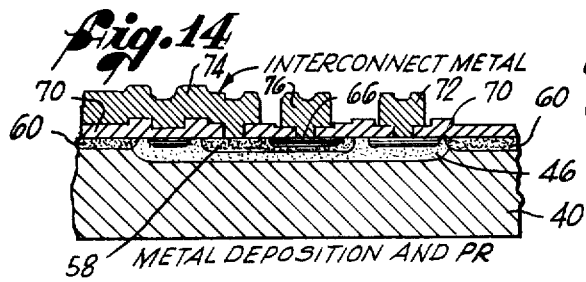
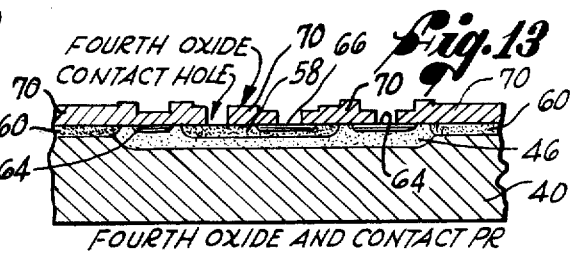
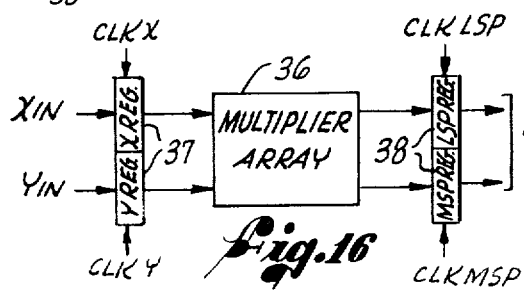
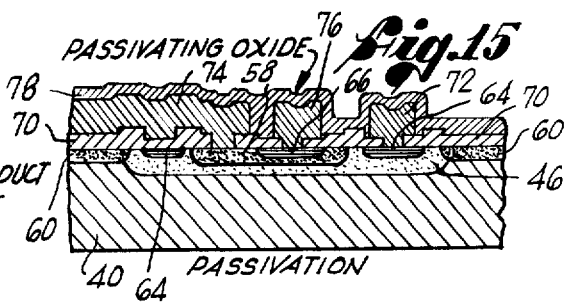

INTEGRATED DIGITAL MULTIPLIER CIRCUIT USING CURRENT MODE LOGIC

BACKGROUND OF THE INVENTION

This invention relates generally to integrated-circuit multipliers, and, more particularly, to digital parallel multipliers, which, as will be discussed, inherently require very large numbers of logic elements.

Integrated or monolithic circuits for performing digital multiplication are, of course, well known. Briefly, and by way of background, such multipliers operate on a digital, usually binary, multiplier quantity, and a corresponding digital multiplicand quantity, to generate a binary product. Typically, the multiplier and multiplicand have equal numbers of binary digits. If the full significance of the quantities multiplied together is to be retained, the product will contain twice as many binary digits (bits) as either the multiplier or the multiplicand. The multiplication process performed in such a circuit essentially follows the procedure used in pencil-and-paper multiplication, but, for maximum speed, all of the necessary one-bit-by-one-bit multiplications are performed in parallel, i.e., essentially simultaneously.

If the necessary input and output interfacing circuits are not considered, a digital parallel multiplier contains only two basic logic elements: a product generator and an adder. However, the number of product generators and adders required in this type of multiplier is approximately equal to the square of the number of bits in the numbers being multiplied. For example, a sixteen-by-sixteen-bit multiplier would require 256 product generators and adders, and these logic elements would together represent nearly 75% of the layout area of a multiplier chip. It will be appreciated, then, that parallel multipliers require relatively large numbers of logic elements, each of which contains a large number of semiconductor devices.

In general, the maximum physical size of an integrated circuit is limited by the inherent number of product defects contained within a unit area of the circuit when manufactured in accordance with a particular fabrication technology. Accordingly, if circuits containing large numbers of semiconductor devices are to be successfully manufactured, i.e., with few defects and relatively high product yields, one alternative is to select a fabrication technology having an inherently high packing density, such as metal oxide semiconductor (MOS) technology or integrated injection logic ($I^2L$). However, these technologies are inherently slow in operation, compared with more conventional bipolar transistor circuitry, so that any advantage in packing density provided by these technologies is obtained at the expense of speed of operation.

A significant step forward in this regard was the development of multipliers manufactured by a triple diffusion fabrication process and utilizing emitter follower logic in their circuit design. The triple diffusion process derives its name from the fact that there are three separate diffusion steps in which impurities are diffused into a silicon substrate at very high temperatures to form the collector, base and emitter regions of transistor devices. As is well known, bipolar transistors may be either of the PNP type or the NPN type, where the designations N and P identify the type of impurity that is added to pure silicon to give its crystalline structure a negative (N) or positive (P) electrical characteristic. A bipolar transistor consists of two junctions between N type and P type material, forming either the PNP or the NPN configuration.

The triple diffusion process is to be distinguished from the epitaxial process and the isoplanar process, both of which involve the growth of an additional single-crystal layer on a silicon substrate.

Emitter follower logic (EFL) is a well known form of transistor logic in which an NPN output transistor is coupled to the emitters of input transistors of the PNP type. One advantage, of this mix of PNP and NPN transistors is that a relatively high packing density can be obtained because of the capability of coalescing adjacent transistors of different types, i.e., the adjacent transistors can share regions of semiconductor material without the need for wasteful isolation regions between them. Moreover, the PNP transistor is somewhat smaller than the NPN transistor, and this factor also contributes to the high packing density of emitter follower logic. This approach of combining triple diffusion technology with emitter follower logic is described in detail in U.S. Pat. No. 3,900,724, issued in the names of McIver et al and entitled "Asynchronous Binary Multiplier Using Non-Threshold Logic".

In spite of its being a highly significant advance in the art, the emitter follower logic implementation of the multiplier has a number of significant disadvantages. First, emitter follower logic inherently requires a relatively large number of resistive elements, which must be of relatively large resistance value if power consumption is to be reduced to an acceptable level. While this is not a disadvantage in itself when used with previously existing fabrication processes, it is a limiting factor in the development and application of new fabrication technologies with smaller "geometries", i.e., providing for smaller geometrical widths of elements and spacings between adjacent elements, as well as correspondingly shallower depths of diffusion. The conventional process for obtaining relatively high values of resistance is known as "pinching". Each resistance element is essentially an N type region of relatively low sheet resistance, and the pinching process is basically the diffusion of an additional base region to effectively reduce the thickness of the resistance layer, and thereby increase its resistance value. However, if very small geometries are involved in the fabrication process, the control of the pinching process becomes more difficult, so that larger values of resistance must be obtained by using longer resistive elements, which, of course, decrease the packing density.

A second disadvantage of emitter follower logic is that it uses large numbers of PNP transistors, which have an inherently lower frequency response than NPN transistors. The usual criterion by which switching circuits are measured is the "speed-power" product, actually the product of propagation delay time and power consumption. A low speed-power product indicates a desirable combination of high speed and low power.

Emitter follower logic presents additional problems when a number of logic stages are cascaded in series, since the logic is such that the voltage representing a particular logic level falls off from stage to stage. If too many stages are cascaded, a logical high voltage level could ultimately diminish to such an extent that it could be misinterpreted as a logical low voltage level. The possible solutions to this problem in emitter follower logic design are either to operate at relatively high voltage logic levels at early stages, so that the diminished level at later stages can be tolerated, or to include an additional saturating device after a selected number of stages, to restore the signal voltage to its initial level. However, these additional saturating devices effectively increase the time delay involved in operation of the entire circuit. A related disadvantage of emitter follower logic is that the internal collector resistance of a transistor can have a significant effect on the output voltage level of a saturating device used in emitter follower logic to restore the logic voltage level. The effect of a high collector resistance when the transistor is in saturation is to provide a low-level output considerably above ground and closer to a high-level output. The effect can be minimized only by limiting the current or by placing one or more transistors in parallel to reduce the effective collector resistance.

It will be appreciated from the foregoing that there is still a significant need for a digital parallel multiplier circuit that overcomes the aforementioned disadvantages of the prior art, and provides a high-speed, low-power multiplier formed on a substrate at a relatively high packing density, to provide a correspondingly high production yield. The present invention fulfills this need.

SUMMARY OF THE INVENTION

The present invention resides in an integrated digital parallel multiplier circuit employing current mode logic and fabricated using an advanced triple diffusion fabrication process. The advanced triple diffusion process provides for extremely small geometries, down to two-micron ($2 \times 10^{-6}$ meter) spacings between circuit features, with an accompanying improvement in packing density over previously available triple diffusion processes. In addition, the use of current mode logic (CML) uses fewer transistor and resistor devices than emitter follower logic (EFL). For example, whereas a full adder implemented in CML has 34 devices (26 transistors and 8 resistors), the corresponding adder in EFL implementation uses 65 devices (37 transistors and 18 resistors). Moreover, CML uses resistors twenty to thirty times smaller in resistance value than those in a corresponding EFL circuit. In spite of the coalescing capability of PNP transistors used in the EFL approach, the layout area using CML is much smaller than the corresponding area using EFL for the same logic function. For example, a full adder circuit using the advanced triple diffusion process is approximately 0.010 inch square for the CML implementation, as compared with approximately 0.0125 inch square for the EFL implementation. Corresponding differences in a total multiplier array can make the EFL approach totally impractical, because of a low production yield resulting from such a large area, especially in such large arrays as 24-by-24 bits or 32-by-32 bits.

CML has additional advantages in that it employs only NPN transistors, and therefore eliminates the inherently slower PNP transistors. Furthermore, a lower logic voltage swing can be used in CML, which, because of inherent capacitive properties of semiconductor circuits, also contributes to a higher speed, and therefore provides an improved speed-power product. Even more importantly, in CML the logic voltage level at each logic stage is automatically restored without the need for additional saturating devices to perform this function, and CML logic gates can therefore be cascaded without limitation and without loss in logic voltage level.

Basically, then, the invention in its broadest sense is a combination, for use in a monolithic integrated multiplier circuit, comprising a plurality of NPN transistors and a plurality of resistive elements, all fabricated using an advanced triple diffusion process capable of achieving a two-micron feature geometry, and junction depths of a few microns or less, and circuit means for connecting the transistors and resistors to operate in current mode logic.

Since the depths of diffusion in the advanced triple diffusion fabrication process are much less than in previously available triple diffusion processes, the use of pinched resistors is made extremely difficult, and larger areas would be needed to provide large-value resistance elements. However, with the use of CML this problem is obviated, since CML uses fewer resistors, all of which are much lower in value than those used in EFL.

Preferably, the NPN transistors are connected in differential pairs wherever possible. Each such pair is connected by its emitter terminals to a constant current source, and complementary logic input levels are applied to the base terminals of the pair. In this configuration, the voltage difference between high and low logic levels at each stage can be 200-300 millivolts or even less. This difference between the base voltages of the pair is sufficient to cut off current in one transistor, and to steer all of the constant current through the other. Furthermore, because the transistors used in CML are never operated in the saturation region of their characteristic, the internal series collector resistance of the devices has practically no effect on the output voltage level, which is derived from the voltage drop produced by a constant current flowing through a load resistor.

It will be appreciated from the foregoing that the present invention represents a significant advance in the field of high-speed digital parallel multipliers. In particular, the invention provides a multiplier with greatly improved packing density and resultant high production yield, yet with a superior speed-power product. The unique combination of current mode logic and advanced triple diffusion technology therefore provides an integrated multiplier circuit with unequaled performance and productibility. Other aspects and advantages of the present invention will become apparent from the following more detailed description, taken in conjunction with the accompanying drawings.

BRIEF DESCRIPTION OF THE DRAWINGS

FIG. 5 is a simplified diagrammatic plan view of a transistor manufactured in accordance with the advanced triple diffusion process, which forms an essential part of the present invention;

FIGS. 6-15 are sectional views summarizing the sequence of process steps performed in the advanced triple diffusion process; and FIG. 16 is a simplified block diagram of a digital multiplier circuit.

DESCRIPTION OF THE PREFERRED EMBODIMENT

Figure 1:
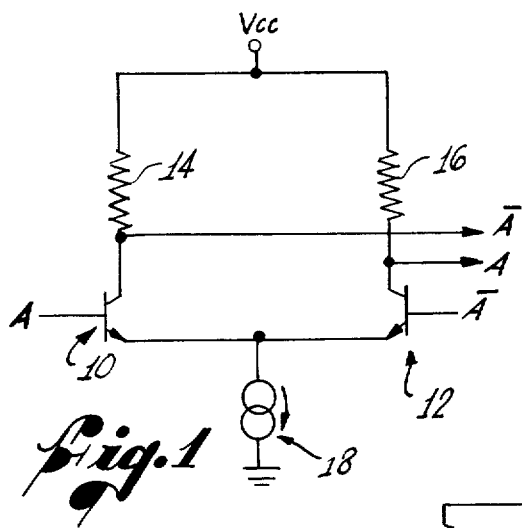
FIG. 1 is a schematic diagram of a basic CML gate.

As shown in the drawings, the present invention is principally concerned with improvements in high-speed parallel digital multipliers, and, in particular, with multipliers in integrated circuit or monolithic form, i.e., fabricated on a single semiconductor chip. In accordance with the invention, a multiplier of superior speed-power characteristics, and greatly improved packing density and production yield, is provided by combining the advantages of current mode logic with the improved packing density and high yield of an advanced triple diffusion fabrication process.

Figure 2:
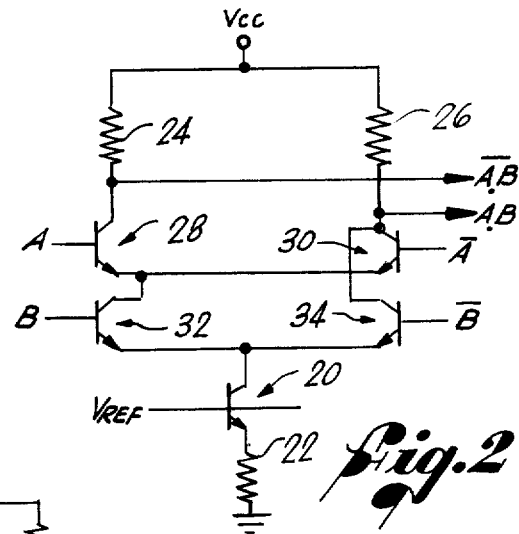
FIG. 2 is a schematic diagram of a two-level AND gate implemented in CML.
Figure 3:
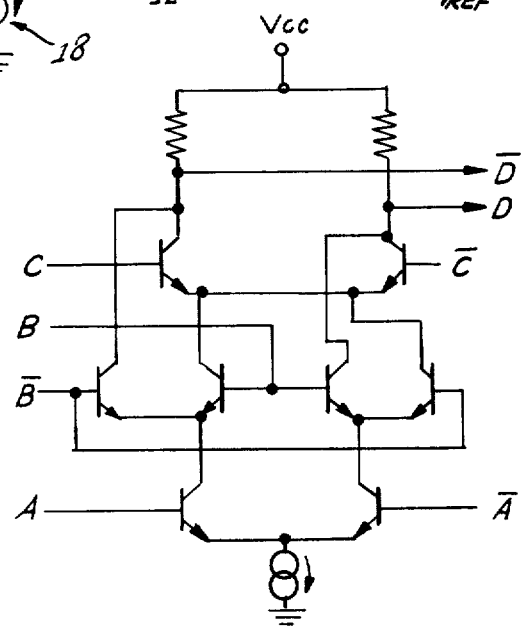
FIG. 3 is a schematic diagram of a typical three-level CML gate.
Figure 4:
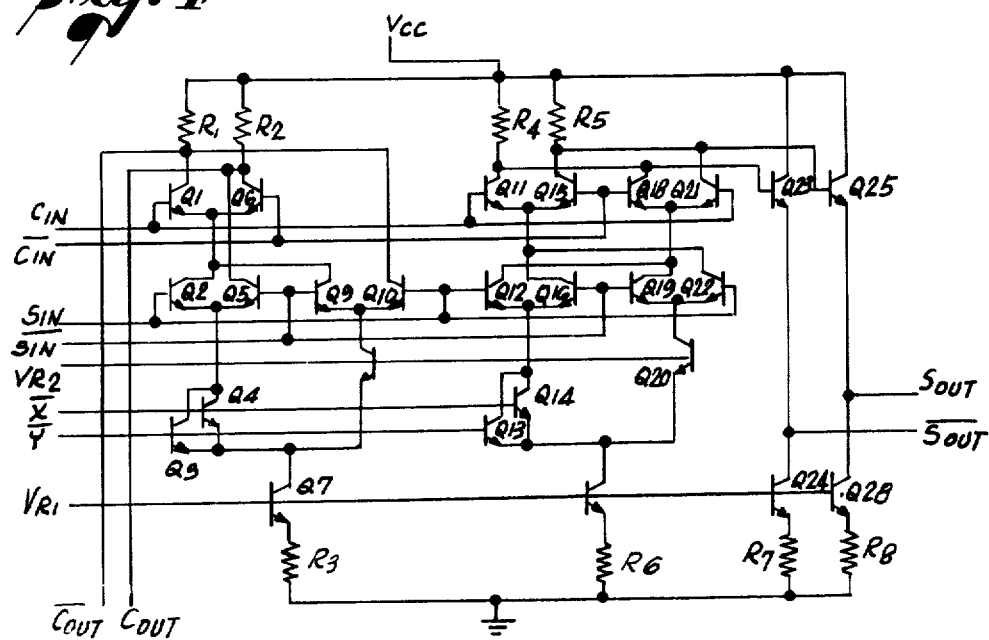
FIG. 4 is a schematic diagram of a full adder and one-bit product generator utilized in the multiplier of the present invention.

FIGS. 1-3 illustrate some basic logic gates that characterize current mode logic (CML), and FIG. 4 shows how CML is implemented in a full adder and one-bit product generator that provides a logical building block for the multiplier of the invention.

As shown in FIG. 1, the basic CML gate is a differential circuit comprising two NPN transistors, indicated by reference numerals 10 and 12, respectively. The collector terminals of the transistors 10 and 12 are connected through resistors 14 and 16, respectively, to a power supply voltage, indicated at $V_{cc}$, and the emitter terminals are connected to ground through a constant current device, indicated at 18. An input signal, indicated at A, is connected to the base of transistor 10, and the inverse input signal $\overline{A}$ is connected to the base terminal of the other transistor 12. Complementary outputs are provided at the collector terminals of the transistors, output level $\overline{A}$ being taken from the collector terminal of transistor 12, and the inverse level $\overline{\overline{A}}$ being taken from the collector terminal of transistor 10. This circuit, which operates as an inverter or amplifier, illustrates the basic configuration of CML logic gates. As will be seen, more practical CML circuits are somewhat more complex.

In operation, the circuit shown in FIG. 1 utilizes the constant current device 18 to provide a constant current through one or the other of the transistors 10 and 12, depending upon the condition of the input signal A. When the input signal A is at a high logic level, the transistor 10 is in a conductive state, but in the active and not the saturated region, and the other transistor 12 is non-conductive. Hence, the collector terminal of transistor 12 is essentially at supply voltage $V_{cc}$, and the collector terminal of transistor 10 is at a somewhat lower voltage because of the voltage drop across resistor 14.

The logic voltage swing, i.e., the difference between logical high and low voltages need be only a few hundred millivolts, since it will be apparent that only a very small difference between the voltages on the bases of the two transistors 10 and 12 is needed to effect cut-off of one of the transistors. For example, if the same voltage were applied to the base terminals of both transistors, the current supplied by the source 18 would ideally be equally divided between the two transistors, but if the base voltage of transistor 10 were increased slightly, the action of the transistor would be such as to tend to greatly increase the collector current through the transistor 10. However, since the total current through the two transistors is limited by the constant current device 18, this would have the effect of moving the operating point of transistor 12 very rapidly to a position of complete cut-off of collector current.

FIG. 1 illustrates the principal characteristic of current mode logic, wherein a constant current device provides a current that is steered through one of more stacks of differential NPN transistor pairs, to yield a logical output taken from the collectors of one or more of the transistor pairs.

FIG. 2 perhaps better illustrates this point in the context of a two-level AND gate. Here, the constant current device takes the form of an NPN transistor 20 and a resistor 22 connected to ground from the emitter of the transistor 20. A reference voltage $V_{REF}$ is applied to the base of the transistor 20 to limit the collector current to an essentially constant level. Again, power is provided from a voltage source, $V_{cc}$, through two resistors 24 and 26, and thence to the collector terminals of a pair of NPN transistors 28 and 30, which are further interconnected with another pair of NPN transistors 32 and 34, the emitters of which are connected to the constant current device, i.e. to the collector terminal of transistor 20.

The emitter terminals of transistors 28 and 30 are connected in common to the collector terminal of transistor 32, and the collector terminal of transistor 30 is connected to the collector terminal of transistor 34. Two input logic levels, A and B, are provided to the respective base terminals of transistors 28 and 32, and the corresponding inverse levels $\overline{A}$ and $\overline{B}$ are applied to the base terminals of transistors 30 and 34, respectively. Output logic levels A.B and $\overline{A.B}$ are taken from the collector terminals of transistors 30 and 28, respectively.

It will be appreciated from the following description of operation that the circuit of FIG. 2 operates as a logical AND gate. When the inputs A and B are both logical zeros (low voltage level), transistors 28 and 32 are turned off, and transistor 34 is turned on. The current path is then through resistor 26 and transistor 34 to the current source, causing the voltage A.B to be less than the voltage $\overline{A.B}$, and hence providing a logical zero output for the AND quantity A.B. When A is zero and B is one, it will be seen that the current path is again through resistor 26, but this time through transistor 30 and transistor 32. Further, when A is one and B is zero, the path is still through resistor 26, and through transistor 34. Finally, when A is one and B is one, the current path is through resistor 24, transistor 28, and transistor 32, thereby providing a logical one output for A.B.

The schematic of FIG. 3 is intended to show a somewhat more complex set of logic involving three input signals, A, B and C, to provide an output signal D in accordance with the equation;

$$D = A.\overline{B} + C.\overline{B} + A.C.$$

where the dot (.) represents the logical AND function, and the plus sign (+) represents the logical OR function.

FIG. 4 is typical of CML as it is employed in the multiplier of the invention. In a computational cell involving a full adder and one-bit product generator, two binary quantities, the inverse of which are indicated by the signal names $\overline{X}$ and $\overline{Y}$, are multiplied together and the result is added to an input binary sum quantity, indicated by $S_{IN}$, and an input carry quantity, indicated by $C_{IN}$, to produce an output binary sum quantity, $S_{OUT}$, together with an output carry quantity $C_{OUT}$. It will be seen that the circuit employs only NPN transistors, connected for the most part in differential pairs, and contains very few resistance devices.

As shown in FIG. 16 a complete multiplier circuit basically comprises a multiplier array 36, for performing the necessary steps of multiplication and addition, a pair of input registers 37 and an output register 38, which may have most significant product (MSP) and least significant product (LSP) fields, as shown, and logic (indicated only by clock signals) for gating input signals representative of numbers to be multiplied into the input registers and gating the resultant product signals out of the output register. This system arrangement is conventional, and is common to practically all parallel digital multipliers.

For this reason, and since the invention is principally concerned with the combination of current mode logic used within each computational cell and an advanced triple diffusion fabrication process, the complete circuit details of a particular multiplier have not been included in the drawings. The extension of CML principles to all aspects of a particular multiplier circuit is a relatively routine engineering task, once the principles and the fabrication process are fully understood. Moreover, the complete schematics of a large multiplier circuit would require twenty or more sheets of drawings, the complexity of which would not serve to clarify the invention any further. However, for purposes of illustration only, the complete schematics of a 16×16 multiplier, designed in accordance with the present invention, were included as an appendix accompanying the application for this patent, and may be found in the patent file at the Patent and Trademark Office.

The triple diffusion process by which the multiplier of the present invention is fabricated is illustrated in FIGS. 5–15. As shown in FIG. 6 a silicon substrate 40 is coated with a first oxide layer 42. Then, as shown in FIG. 7, a rectangular area or window, indicated by the numerals 44, of the first oxide 42 is removed, and an N type material, in this case phosphorous, is implanted in what is to become the collector region of the transistor, indicated at 46 in FIGS. 9 and 10.

The area of the collector region 46, and the areas of the other diffusion regions of the transistor, are all defined geometrically by means of a conventional photoresist (shown as PR in the drawings) process, which is not illustrated in these drawings. Basically, in such a process a photosensitive coating known as a photoresist is deposited on the oxide, and then selectively exposed to ultraviolet light through a photolith mask (not shown). In the particular case of the collector region 46, the mask defines the rectangular window 44. The exposed window area of the photoresist is subsequently washed away, and then the oxide in the window area is etched with acid to expose the underlying silicon substrate, leaving the window 44, as shown in FIG. 7. The N type collector material, indicated at 48, can then be implanted in the collector window region, and the remaining oxide layer 42 stripped off, as indicated in FIG. 8. In a subsequent diffusion operation, a second oxide layer 50 is formed as indicated in FIG. 9, and the N type collector material 48 is diffused into the substrate 40 to form the collector region 46.

The collector diffusion region 46 is approximately 3.5 microns deep, has a surface concentration of $2 \times 10^{17}$ cm$^{-3}$ and a sheet resistance of approximately 500 ohms per square. Sheet resistance, as is well known, is a term usually applied to the electrical resistance of a conductive or semiconductive layer. The resistance to current flow from one edge of a square sheet of such a layer, to the opposite edge, is independent of its area.

Next, as shown in FIG. 10, the second oxide layer 50 is selectively removed to form a base-region window, indicated at 52. Portions of the oxide layer 50 situated outside of the collector region 46 are also removed. Then, a P type material, in this case boron, is implanted in the base-region window 52, as indicated at 54, and is also implanted in the exposed regions of the substrate outside of the collector region 46. Then, as shown in FIG. 11, a third oxide layer 56 is added, and the boron is diffused to a depth of approximately 1.2 microns, to form the base region 58. The base region has a depth of approximately 1.2 microns, a surface concentration of $1 \times 10^{19}$ cm$^{-3}$ and a sheet resistance of 150–200 ohms per square. The P type boron material is also diffused into the surrounding field region outside of the collector regions 46. This field diffusion region, indicated at 60, increases the surface concentration of the substrate 40, and effectively isolates adjacent devices from each other.

Next, as shown in FIG. 12, the third oxide layer 56 is selectively removed, again using the photoresist process, to expose an emitter-region window 62 over the base region 58, and also to expose a continuous rectangular strip 64 (FIG. 5) over the collector region 46. An N+ type phosphorous emitter material is implanted in the exposed areas, and is diffused to a depth of approximately 0.9 micron, to form the emitter region 66, and also to form a continuous N+ type region beneath the rectangular strip 64 around the collector region, for purposes of making contact with the collector. The surface concentration of the emitter region 66 is approximately $1 \times 10^{21}$ cm$^{-3}$ and the sheet resistance is approximately 18–25 ohms per square.

As shown in FIG. 13, a fourth oxide layer 70 is applied over the already formed layers, and is selectively removed to expose contact holes to be used for making electrical contact with the various semiconductor regions. Then, metal contact strips are formed, again using a conventional photoresist process that is not shown in detail. First, a metalized layer is applied over the entire structure, then a photoresist layer is applied over the metal, selectively exposed through a photolith mask, and washed away to leave photoresist material over those areas of metal to be retained. Then the remaining, unmasked areas of metal are etched away to leave the interconnecting metal strips shown in the drawings. In particular, as shown in FIG. 14, there is a collector contact strip 72, which makes contact with the N+ field diffusion layer 60 around the outer periphery of the collector area 46, a base contact strip 74, which makes direct contact with the base region 58, and, finally, an emitter contact strip 76, which makes direct contact with the center of the emitter region 66. The final step in the fabrication process is the application of a passivating oxide layer 78 over the entire structure.

The metal contact strips 72, 74 and 76 are single layers approximately 10,000–15,000 angstroms thick (1–1.5 microns). Each metalized layer comprises a thin first coating of titanium, approximately 100 angstroms thick, with the remainder of the layer comprising copper and aluminum. The metal strips are spaced by a minimum of 2 microns from each other, and are a minimum of 7 microns wide. All other features of the device have a minimum geometry of 2 microns, which applies to both width and spacing. The areas of the semiconductor regions can be dimensioned as desired, within this geometric limitations. The area of the emitter region 66 in the presently preferred embodiment is approximately 5-6 microns and the contact holes are 3 microns wide.

It will be apparent from the foregoing that the present invention represents a significant advance in the field of multipliers. In particular, the invention provides a multiplier having a superior speed-power product, but with the ability to be fabricated at a relatively high packing density, for maximum production yield. Moreover, the multiplier of the invention overcomes many of the problems inherent in multipliers utilizing emitter follower logic. It will also be appreciated that, although a particular embodiment of the invention has been described in detail for purposes of illustration, many modifications may be made without departing from the spirit and scope of the invention. Accordingly, the invention is not to be limited except as by the appended claims.

I claim:

1. For use in a monolithic integrated multiplier circuit, the combination of:
   a plurality of NPN transistors and resistors fabricated in accordance with a high-density triple diffusion process allowing for use of a two-micron minimum geometry, and correspondingly small junction depths, to provide a very high packing density and a corresponding low defect rate and low production cost; and
   circuit means for connecting said transistors and resistors to operate in current mode logic, to provide a circuit with fewer and smaller resistors, and a desirably low speed-power product.

2. The combination as set forth in claim 1, wherein said circuit means includes:
   means for connecting the base terminal of a first one of said transistors to a reference voltage to provide for essentially constant current through the collector of said first transistor when voltage is applied between its collector and emitter terminals; and
   means for connecting others of said transistors in a plurality of differential pairs between said first transistor collector and a voltage source, wherein each differential pair has commonly connected emitter terminals,
   a first differential pair has each of its collector terminals connected to one of said resistors and thence to the voltage source,
   a second differential pair has its emitter terminals connected to the collector of said first transistor,
   the remaining ones of said differential pairs are connected between said first and second differential pairs, to provide a selected current path between said voltage source and said first transistor, said current path being determined by the states of complementary pairs of input signals applied to the base terminals of each of said differential pairs, and
   complementary output signals are obtained at the collector terminals of said first differential pair, said output signals being determined by the states of said input signals and by the interconnected configuration of said differential pairs, to derive a selected logical function of said input signals.

3. The combination as set forth in claim 2, wherein: said input signals represent one-bit quantities to be added together; and
   said output signals represent one bit of the arithmetic sum of said input quantities.

4. A monolithic integrated multiplier circuit comprising:
   a plurality of NPN transistor devices; and
   a plurality of resistance devices;
   said transistor devices and resistance devices being interconnected in current mode logic to form a multiplier circuit having a low speed-power product and being capable of performing parallel multiplication of two multi-digit numerical input quantities, to produce a multi-digit numerical output quantity, and said transistor and resistance devices being formed on a single substrate by a triple diffusion process providing for as low as two-micron feature widths and spacings, for high packing density and a corresponding low defect rate and low production cost, and wherein said resistance devices are formed as unpinched n-type diffusion regions in said substrate, to maintain the high density, low defect rate and low production cost.

5. A multiplier circuit as set forth in claim 4, wherein: said transistor devices are for the most part connected to provide an arrangement of interconnected logic gates and constant current means, said logic gates including means for steering the constant current through said logic gates in accordance with the states of input signals supplied to said logic gates, thereby to provide output signals derived from said input signals by said arrangement of logic gates.

6. A multiplier circuit as set forth in claim 5, wherein: said logic gates comprise complementary pairs of said transistors, each of said pairs having its emitter terminals coupled together and having complementary pairs of input signals applied to its respective base terminals, whereby the current supplied by said constant current means is steered through one or the other of the collector circuits of said pair of transistors in accordance with the states of said complementary input signals.

7. A multiplier circuit as set forth in claim 6, wherein: said constant current means include a plurality of said transistors, each having one of said resistance devices in its emitter circuit and each having its base terminal connected to a fixed reference voltage; and
   remaining ones of said resistance devices are connected between a voltage source and collector terminals of some of said pairs of transistors, to provide complementary output voltage levels at the collector terminals of at least one of said pairs of transistors, as determined by which one of said pair is in a conductive state.

8. A multiplier as set forth in claim 4, wherein: each of said transistors has an N type collector region diffused to a depth of approximately 3.5 microns, a P type base region diffused to a depth of approximately 1.2 microns into said collector region, and an N+ type emitter region diffused to a depth of approximately 0.9 micron into said base region.

* * * * *